Dec. 28, 1965 K. REUSCHEL 3,226,254

METHOD OF PRODUCING ELECTRONIC SEMICONDUCTOR DEVICES BY PRECIPITATION OF MONOCRYSTALLINE SEMICONDUCTOR SUBSTANCES FROM A GASEOUS COMPOUND

Filed June 6, 1962

3,226,254

METHOD OF PRODUCING ELECTRONIC SEMICONDUCTOR DEVICES BY PRECIPITATION OF MONOCRYSTALLINE SEMICONDUCTOR SUBSTANCES FROM A GASEOUS COMPOUND

Konrad Reuschel, Pretzfeld, Upper Franconia, Germany, assignor to Siemens-Schuckertwerke Aktiengesellschaft, Berlin-Siemensstadt, Germany, a corporation of Germany Filed June 6, 1962, Ser. No. 200,525
Claims priority, application Germany, June 9, 1961, S 74,266
2 Claims. (Cl. 117—201)

My invention concerns a method of producing electronic semiconductor devices and composite circuit components that comprises a monocrystalline body with zones of respectively different conductance types or different dopant concentrations. More particularly, my invention relates to the production of stratified semiconductors by precipitating semiconductor substance from the gaseous phase upon heated carrier crystals of semiconductor material having the same or substantially the same lattice structure as the semiconductor substance being precipitated.

Semiconductor devices of the type mentioned are employed, for example, as individual electronic components such as transistors, rectifiers or four-layer p-n junction devices, and also as parts or assemblies in microcircuitry. The above-mentioned precipitation of semiconductor substance upon heated carrier crystals is known, for example, from German Patent 865,160 and U.S. Patent 3,011,877 and described in U.S. patent application of Schweickert, Serial No. 90,291, filed February 20, 1961, now Patent No. 3,099,534.

It is known to perform such a precipitation method by placing a number of semiconductor plates upon a supporting strip of metal and to heat the plates to pyrolytic precipitation temperature by passing electric current through the supporting strip which transmits heat by conduction to the semiconductor plates. This method involves a relatively large proportion of faulty products, partly due to substance diffusing from the strip into the semiconductor material.

It is an object of my invention to afford the simultaneous production of a large number of stratified semiconductor devices or components while avoiding the just-mentioned danger of contamination and greatly reducing the number of rejects.

According to my invention, I place a number of disc- or plate-shaped carrier crystals upon each other to form a rod-shaped stack, and I then subject the stack to the flow of a gas containing a gaseous compound of the semiconductor substance to be precipitated upon the plates in mixture with a gaseous reaction agent such as hydrogen. At the same time the stack is heated to the pyrolytic temperature required for reducing the semiconductor substance from the gaseous compound and precipitating it upon the heated surface of the carrier plates. The heating is effected preferably by radiation or by electric inductance heating.

The method is preferably performed by precipitating upon the crystalline carrier body a semiconductor substance consisting of the same semiconductor material, for example by precipitating germanium from the gaseous phase upon a carrier body of germanium, or by precipitating silicon upon silicon. However, the carrier crystal may also consist of semiconductor substance different from that to be precipitated from the gaseous phase. For example, when germanium is precipitated upon carrier of silicon, the germanium coating can be contacted by electrodes or terminals at lower temperatures than required for fusing or alloying a contact to silicon, and the contacting materials may also be different from those needed for silicon. The essential conditions for such precipitation of different semiconductor substances are that the reaction temperatures for the dissociation of the semiconductor substance from the gaseous compound and for precipitation upon the carrier be lower than the melting temperature of the carrier material, and that the lattice constants of carrier crystal and precipitating semiconductor substance differ no more than about 5% from each other. Accordingly, for example, germanium can be precipitated upon silicon, gallium arsenide (GaAs) upon germanium, aluminum arsenide (AlAs) on germanium or on silicon, gallium arsenide (GaAs) upon aluminum arsenide and conversely, aluminum phosphide (AlP) on silicon, gallium phosphide (GaP) on silicon, and indium phosphide (InP) on germanium.

One substance may also merge with the other through mixed-crystals. For example, if germanium is to be precipitated upon a silicon monocrystal, the precipitation can be started, for example, by precipitating silicon from a corresponding silicon compound such as silicon tetrachloride ($SiCl_4$) or silicochloroform ($SiHCl_3$). Then a gradually increasing quantity of the corresponding germanium compound is added to the gas flow passing into the reaction chamber while correspondingly reducing the amount of silicon compound. In this manner, the process is gradually converted to precipitation of germanium only.

The precipitation of semiconductor substance from the corresponding compounds thereof, for example their halogen compounds, is preferably effected by chemical reaction, for example by reduction with hydrogen. Generally, a large excess of hydrogen is used. In this case, hydrogen also serves as carrier gas for driving the gaseous atmosphere through the reaction chamber.

The above-mentioned and more specific objects, advantages and features of my invention, said features being set forth with particularity in the claims annexed hereto, will be apparent from the following description taken in conjunction with the accompanying drawing in which:

Figures 1, 2, 3, 4, 5:
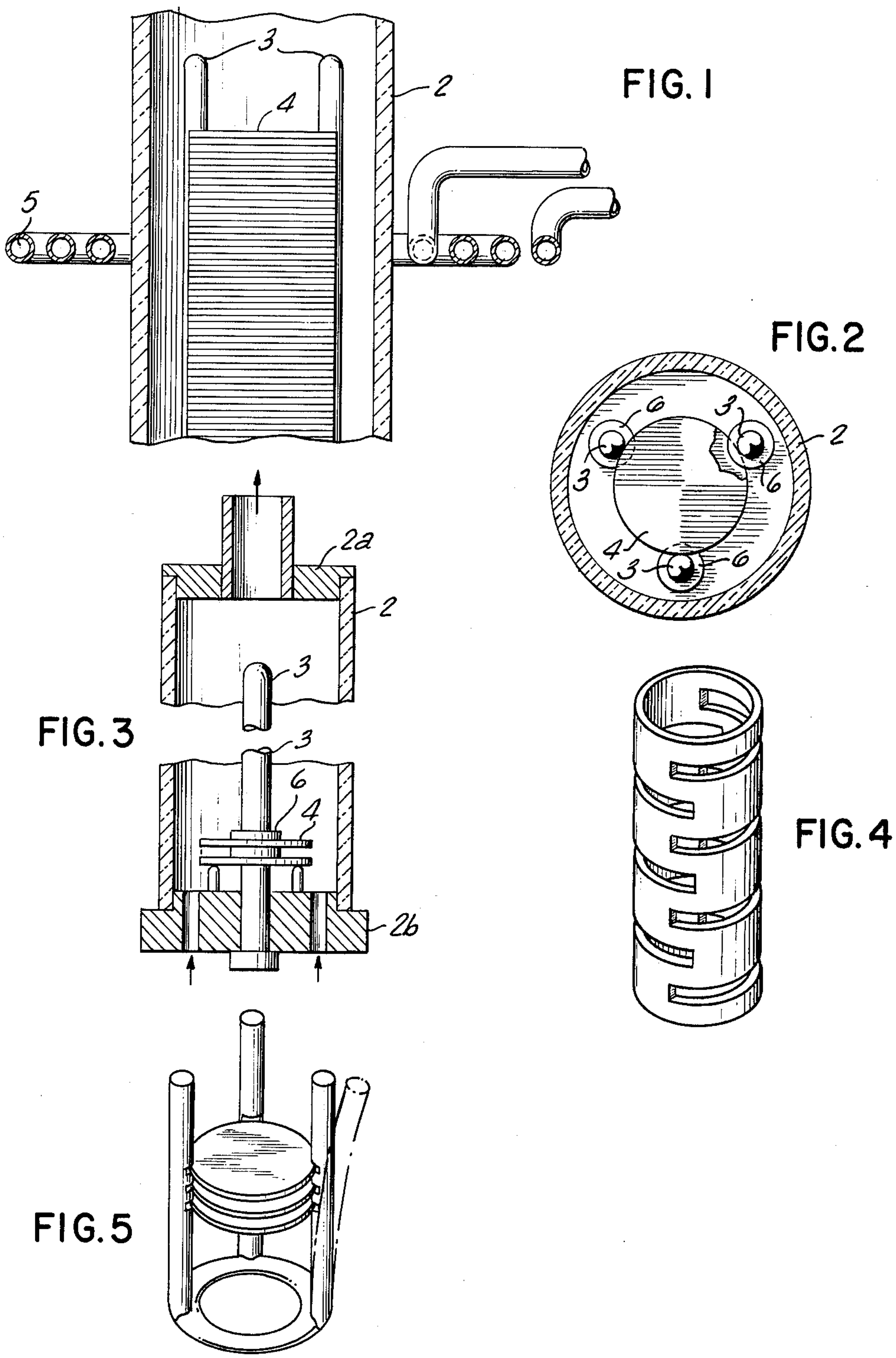
FIG. 1 shows partially and in section an apparatus for performing the method.
FIG. 2 is a cross sectional view for one modification.
FIG. 3 is a longitudinal section of another embodiment showing the top and bottom portions of the same apparatus.
FIGS. 4 and 5 are two holders for supporting the semiconductor plates.

The processing vessel consists essentially of a quartz tube 2 closed and sealed at the top and bottom by suitable closures *2a* and *2b* which are provided with inlet and outlet ducts, respectively, for the processing gas. Mounted in the vessel are three parallel elongated pins 3, the pins forming a triangle on the base closure *2b* of the apparatus and secured thereto. Semiconductor crystals in form of circular discs 4, consisting for example of silicon, are stacked into the space defined by the three parallel pins 3. The semiconductor plates theoretically contact each other in three points; practically they contact each other in three or more points or in a point and a line. The average distance between the plates is between about 10 to 15 microns so that there is sufficient space for a precipitated layer of 4 or 5 microns, for example. At the high temperatures involved, the gas has sufficient mobility to enter the small spaces between the discs and precipitates over the entire surface of the discs with the exception of the small contact points. The pins facilitate stacking and also hold the stack in proper position. The base plate 2b in which the pins 3 are fastened may consist of graphite, and the same material may be used for the top closure 2*a*. The pins preferably consist of highly pure semiconductor material, for example silicon, in order to reliably prevent contamination of the semiconductor plates stacked between the pins.

The apparatus, comprising the tubular vessel 2 and the pins 3, is preferably mounted in vertical or nearly vertical position. When the apparatus is mounted in inclined position, two pins 3 are sufficient for reliably holding the stack of semiconductor plates. The tube 2 is surrounded by an induction heater coil 5 which is displaceable in the longitudinal direction of the tube. The coil 5 is to be connected to a high-frequency generator furnishing a voltage of 3 to 5 megacycles per second, for example. The coil 5 preferably consists of copper tubing which is traversed by liquid coolant during operation. After placing the stack of semiconductor plates into the vessel, a reaction gas mixture is supplied through the base plate 2*b* and passes along the discs before it leaves the outlet in the top closure 2*a*. Simultaneously, the stack of semiconductor plates is heated for precipitation of semiconductor substance onto the plates.

When performing the method, a glowing zone is produced in the rod-shaped stack of plates 4 and is progressively passed lengthwise, comparable to the melting zone in the floating-zone melting method, through the stack by moving the heater coil 5 along the tube 2. The precipitation of semiconductor substance from the gas mixture then takes place mainly at the location of the glowing zone. The traveling speed of the heater coil and hence of the glowing zone may be kept so low that a sufficiently thick coating of precipitated material is produced on the carrier plates 4 during the first, single pass of the glowing zone. However, the glowing zone may also be passed several times lengthwise through the semiconductor stack in order to obtain a multiple precipitation of semiconductor substance. The mode to be preferred depends upon such factors as the design of the particular semiconductor devices and the particular materials being employed.

Since highly pure semiconductor substances are virtually insulating when cold, it is necessary to preheat the stack of semiconductor plates 4 prior to commencing the precipitation proper. Such preheating can be effected, for example, with the aid of radiation sources such as electric arc lamps. However, the stack can be made electrically conductive in other ways. For example, at one location of the stack, preferably at its upper or lower end, a plate or disc of conductive material may be inserted. The inserted disc consists, for example, of molybdenum or tungsten as employed for the carrier plates of many semiconductor devices. Inductive heating is then initiated by placing the heater coil 5 in the immediate vicinity of the inserted metal disc. The disc then becomes heated to incandescent temperature and the heat is imparted to the adjacent semiconductor substance of the stack which then also becomes conductive. Consequently, by starting the induction heating at the location of the inserted metal disc, the glowing zone can be readily passed through the entire stack.

When proceeding in this manner, the crystalline plates that compose the stack are coated with a grown layer of precipitated semiconductor substance in a progressive sequence, the plates closer to the starting point of the glowing-zone pass being coated earlier than the other plates.

However, in some cases the heating of the stack may be effected only by radiation. This can be done by bunching or focusing the heat rays upon the length of the stack by means of concave reflectors. If the heat radiation is thus directed over the entire length of the stack, all plates can be coated simultaneously. However, when applying heat radiation, it is preferable to heat only part of the semiconductor stack by passing a glowing zone through the stack, for example by displacing the entire apparatus, comprising the tube 2 and the pins 3, relative to the radiation heating device.

The shape of the semiconductor plates and consequently the cross section of the rod-shaped stack, may be circular as illustrated. However, the semiconductor plates can be given any other desired shape. In some such cases a different arrangement of the holder pins 3 becomes necessary for properly accommodating and holding the plates.

The precipitation of semiconductor substance upon the crystalline semiconductor plates 4 results in semiconductor bodies whose core zone consists of the original substance, for example silicon of p-type conductance, and which have layers of precipitated semiconductor substance, for example n-type silicon, on the top and bottom sides. Such a device constitutes an n-p-n transistor. An analogous method is applicable for the production of p-n-p transistors by employing original carrier crystals of n-type semiconductor substance and precipitating thereupon a p-type semiconductor material. For using such devices as rectifier diodes, one of the outer layers, for example an n-type layer of the embodiment first mentioned, must be removed. This can be done by lapping, sand-blasting or etching. The portions or areas of the semiconductor that are not to be subjected to attack by etching agent can be masked off with a varnish resistant to the etching agent, for example picein varnish.

At those individual points of the semiconductor plates where they touch each other, they tend to grow together by precipitated semiconductor substance. When the plates are thereafter separated from each other, such locations of original contact constitute faults. However, such locations can be sorted out by dividing the semiconductor plates into smaller units. In any event, the consumption of semiconductor substance by eliminating faulty locations is considerably smaller than the consumption of semiconductor material involved in the heretofore known method according to which semiconductor discs are placed flat upon a strip of semiconductor material and are heated by passing current through the strip material. If the heating strip is made of other materials, such as metal, a contamination of the products can never be completely avoided.

When producing semiconductor devices of relatively large size, it is preferable to provide spacer pieces between the individual semiconductor plates of the stack in order to ascertain that the plates are contacted only at predetermined points thus limiting any possible faults to such locations. The spacer pieces may consist of circular rings. An example of such a spacer ring is shown at 6 in FIGS. 2 and 3. While the spacer ring is shown mounted on the supporting pins 3, the spacer rings may also be inserted between the pins in the same manner as the semiconductor plates, and as in the case of stacked semiconductor plates, rest on a plate in only a few points leaving sufficient space for the reaction gas to readily pass at the temperature involved. A large layer of failure-free semiconductor material grows in the interspace between adjacent plates. The spacer pieces preferably consist of the same semiconductor material as the crystal plates 4 in order to reliably prevent contamination and also promote the inductive electric heating.

In FIG. 4 is a hollow rod carrier of about 18 mm. diameter, for example, which is made out of quartz or high purity (spectral) carbon, for example. On alternate sides of the rod slits are cut. The incisions are, for example, 0.5 mm. in height. Discs of semiconductor material of smaller height are readily inserted into said incisions. Since the discs contact the hollow carrier at only a few points, the discs with a precipitated layer thereon have only a few failure locations.

In FIG. 5 is a holder in which three quartz rods are fastened to a quartz ring. With the use of a diamond saw, for example, small cuts are made in the quartz rods, in which cuts plates may be located. Quartz is sufficiently elastic, so that the semiconductor plates may be inserted without difficulty. The deflection of the quartz rod in the drawing is exaggerated.

It will be understood from the foregoing that the invention is applicable not only for the production of n-p-n and p-n-p- transistors and rectifiers but also for the production of any other semiconductor devices, including four-layer devices such as controlled rectifiers of thyratron performance. The precipitation of layers having respectively different conductance type can be effected successively by admixing corresponding dopant substance to the reaction gas mixture. Thus, for example, boron chloride ($BCl_3$) and phosphorus trichloride ($PCl_3$) can be added to the reaction gas mixture for the production of p-type and n-type layers respectively.

For avoiding lattice disturbances during crystal growth, it is in some cases of advantage to change for a short interval of time prior to commencing the precipitation process proper, the mole ratio of the reaction gases or/and the reaction temperature so that a slight amount of semiconductor material is carried away from the semiconductor rod, thus securing an undisturbed crystalline surface constitution which subsequently secures a monocrystalline growth of the layers being precipitated. This method is also described in the copending application Serial No. 813,583, filed May 15, 1959, of myself and others, abandoned in favor of Serial No. 281,857, filed May 9, 1963, and now Patent No. 3,171,755 to which reference may be had for further details of design. The various methods and modifications described in that application as well as those described in the copending application Serial No. 737,254, filed May 23, 1958, now Patent No. 3,042,494 of H. Gutsche can be used to particular advantage in combination with the present invention. If desired, the concentration of the added gaseous compound of a doping substance can be varied and thereby a continuous change in dopant concentration of the precipitated semiconductor substance be effected.

Such and other modifications will be obvious to those skilled in the art, upon a study of this disclosure and particularly in conjunction with the disclosures of the above-mentioned copending applications, and are indicative of the fact that my invention can be given embodiments other than particularly illustrated and described herein, without departing from the essential features of the invention and within the scope of the claims annexed hereto.

I claim:

1. The method of producing electronic semiconductor devices having a monocrystalline body with zones of respectively different conductance, by precipitation of semiconductor substance from the gaseous phase onto a semiconducting carrier crystal, which comprises placing a plurality of plate-shaped carrier crystals in alternating succession with spacer members of the same semiconductor substance upon each other to form a rod-shaped stack, subjecting the stack to a flow of gas containing a gaseous compound of the semiconductor substance to be precipitated mixed with a gaseous reaction agent, and simultaneously heating the stack to pyrolytic temperature to coat the carrier crystals with precipitating semiconductor substance.

2. The method of producing electronic semiconductor devices having a monocrystalline body with zones of respectively different conductance, by precipitation of semiconductor substance from the gaseous phase onto a semiconducting carrier crystal, which comprises placing a plurality of plate-shaped carrier crystals in alternating succession with spacer members of the same semiconductor substance upon each other to form a rod-shaped stack, subjecting the stack to a flow of gas containing a gaseous compound of the semiconductor substance to be precipitated mixed with a gaseous reaction agent, and simultaneously passing a glowing zone lengthwise through the stack, said zone being axially narrow relative to the length of the stack and having pyrolytic temperature, whereby layers of semiconductor substance are grown on said carrier crystals as the crystals become successively located in the traveling zone.

References Cited by the Examiner

UNITED STATES PATENTS

| | | | |
|---|---|---|---|
| 2,520,334 | 8/1950 | Peters | 117—106 X |
| 2,834,697 | 5/1958 | Smits | 148—189 |
| 2,880,117 | 3/1959 | Hanlet | 148—175 X |
| 3,011,877 | 12/1961 | Schweickert et al. | 117—106 X |
| 3,031,338 | 4/1962 | Bourdeau | 117—107.2 |
| 3,047,438 | 7/1962 | Marinace | 117—106 X |
| 3,053,638 | 9/1962 | Reiser | 117—106 X |
| 3,140,966 | 7/1964 | Wartenberg | 148—175 |
| 3,142,596 | 7/1964 | Theuerer | 148—175 |

JOSEPH B. SPENCER, *Primary Examiner.*

RICHARD D. NEVIUS, *Examiner.*